(12) United States Patent
Chi et al.

(10) Patent No.: US 8,828,796 B1
(45) Date of Patent: Sep. 9, 2014

(54) SEMICONDUCTOR PACKAGE AND METHOD OF MANUFACTURING THE SAME

(71) Applicant: Siliconware Precision Industries Co., Ltd., Taichung (TW)

(72) Inventors: Chieh-Yuan Chi, Taichung (TW); Wei-Yu Chen, Taichung (TW); Hung-Wen Liu, Taichung (TW); Yan-Heng Chen, Taichung (TW); Hsi-Chang Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/085,168

(22) Filed: Nov. 20, 2013

(30) Foreign Application Priority Data

Apr. 25, 2013   (TW) .............................. 102114776 A

(51) Int. Cl.
*H01L 21/44* (2006.01)
*H01L 23/02* (2006.01)
*H01L 23/498* (2006.01)

(52) U.S. Cl.
CPC .............................. *H01L 23/49861* (2013.01)
USPC .......................................... 438/106; 257/686

(58) Field of Classification Search
CPC ........... H01L 2924/01078; H01L 2924/01079; H01L 2924/01029; H01L 2924/01013; H01L 2924/14
USPC ........................ 438/106–110, 112, 612, 127; 257/685–686, 777, 780, 737–738
See application file for complete search history.

(56) References Cited

U.S. PATENT DOCUMENTS

2009/0315168 A1* 12/2009 Coteus et al. ................. 257/686
2010/0109139 A1*  5/2010 Lee .............................. 257/686

* cited by examiner

*Primary Examiner* — (Vikki) Hoa B Trinh
(74) *Attorney, Agent, or Firm* — Edwards Wildman Palmer LLP; Peter F. Corless; Steven M. Jensen

(57) ABSTRACT

A semiconductor package and a method of manufacturing the same are provided, the semiconductor package including a first package unit having a first encapsulant and a first semiconductor element, a second package unit having a second encapsulant and a second semiconductor element, a supporting member interposed between the first and second encapsulant, a plurality of conductors penetrating the first encapsulant, the supporting member and the second encapsulant, and redistribution structures disposed on the first and second encapsulants, wherein the first and second encapsulants are coupled with each other by the supporting member to provide sufficient support and protection to enhance the structure strength of the first and second package units.

18 Claims, 6 Drawing Sheets

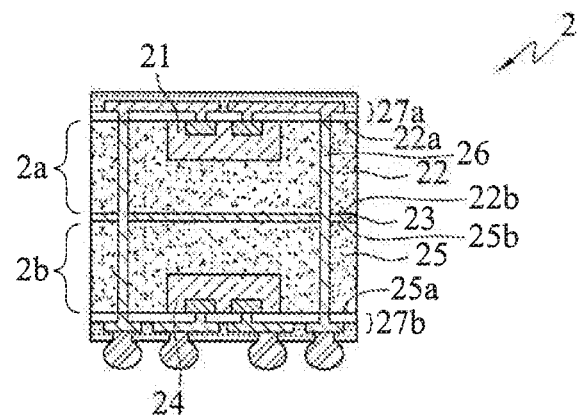
FIG.2I
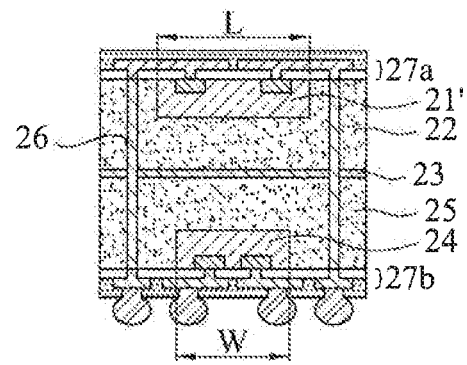
FIG.2I'
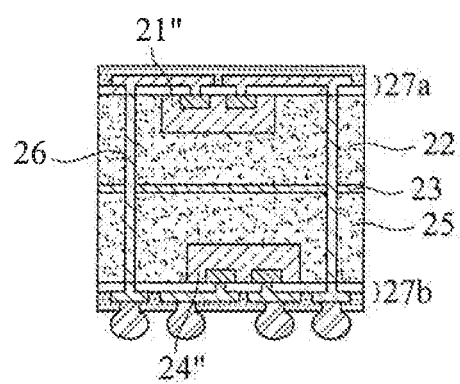
FIG.2I"

SEMICONDUCTOR PACKAGE AND METHOD OF MANUFACTURING THE SAME

CROSS-REFERENCES TO RELATED APPLICATIONS

This application claims under 35 U.S.C. §119(a) the benefit of Taiwanese Application No. 102114776, filed Apr. 25, 2013, the entire contents of which is incorporated herein by reference.

BACKGROUND OF THE INVENTION

1. Field of the Invention

The present invention relates to semiconductor packages, and, more particularly, to a semiconductor package having an enhanced structure strength and a method of manufacturing the same.

2. Description of Related Art

With the flourishing of electronic industry, electronic products are gradually having various functions and high performance. In order to meet the package requirement for the miniaturization of semiconductor packages, a wafer level packaging (WLP) technique is thus developed. However, with the advance of technology, an electronic package structure is required to be provided with more input/output (I/O) in order to have its performance improved, and meet the requirements for electronic package products in the future. Therefore, the technique of having trace layout on both sides of a semiconductor is developed to meet the number requirement of I/O of a package product.

FIGS. 1A-1E are cross-sectional views of a method for manufacturing a semiconductor package 1 according to the prior art.

As shown in FIG. 1A, a mold 13 is provided, a carrier 10 having a connection layer 100 is disposed at top and bottom sides of the mold 13, the connection layer 100 has a plurality of first semiconductor elements 11 and second semiconductor elements 14 disposed thereon, and an encapsulant 12 is filled in the mold 13.

As shown in FIG. 1B, the mold 13 is compressed such that the encapsulant 12 encapsulates the first semiconductor elements 11 and second semiconductors 14. Subsequently, the mold 13, the carrier 10 and the connection layer 100 thereof are removed to obtain a package unit 1a.

As shown in FIG. 1C, which illustrates a portion of FIG. 1B, a plurality of perforations 160 penetrating the encapsulant 12 are formed.

As shown in FIG. 1D, conductors 16 are formed in the perforations 160.

As shown in FIG. 1E, redistribution layer structures 17 are formed on the top and bottom sides of the encapsulant 12, such that the redistribution layer structures 17 are electrically connected to the conductors 16 and the first and second semiconductor elements 11 and 14. Subsequently, conductive elements 19 such as solder balls are formed on the bottom sides of the redistribution layer structures 17, such that the conductive element 19 is electrically connected to the redistribution layer structures 17 and external elements (not illustrated). A singularizing process is then performed to obtain a plurality of semiconductor packages 1.

However, after the mold 13, the carrier 10 and the connection layer 100 thereof are removed according to the prior art, the package unit 1a lacks sufficient support and protection, and thus is easily damaged while the perforations 160 are formed.

Moreover, due to lack of sufficient support and protection, warpage of the encapsulant 12 tends to occur. Therefore, the positioning of perforations 160 is easily shifted, such that the redistribution layer structures 17 are not effectively coupled to the conductors 16. It thus result in adverse influence on the electrical connection between the redistribution layer structures 17 and the conductors 16, and causing the poor yield, bad product reliability, and high cost.

Thus, how to overcome various problems in the prior art is substantially an issue desired to be solved.

SUMMARY OF THE INVENTION

According to the above disadvantages of the prior art, the present invention provides a semiconductor package, which comprises a first package unit including a first encapsulant having opposite first and second sides, and a first semiconductor element embedded in the first encapsulant and exposed to the first side; a second package unit including a second encapsulant having opposite third and fourth sides, and a second semiconductor element embedded in the second encapsulant and exposed to the third side; a supporting member that connects the second side of the first encapsulant to the fourth side of the second encapsulant, so as to couple the first package unit to the second package unit; a plurality of conductors penetrating the first encapsulant, the supporting member and the second encapsulant, so as to connect the first side of the first encapsulant to the third side of the second encapsulant; and redistribution layer structures disposed on the first side of the first encapsulant and the third side of the second encapsulant, such that the redistribution layer structures are electrically connected to the conductors and the first and second semiconductor elements.

The present invention further provides a method for manufacturing semiconductor packages, comprising providing a first package unit and a second package unit, the first package unit including a first encapsulant having opposite first and second sides, and a first semiconductor element embedded in the first encapsulant and exposed to the first side, the second package unit including a second encapsulant having opposite third and fourth sides, and a second semiconductor element embedded in the second encapsulant and exposed to the third side, the second side of the first encapsulant of the first package unit being connected to a supporting member; connecting the fourth side of the second encapsulant to the supporting member, such that the first package unit is coupled to the second package unit; forming a plurality of perforations penetrating the first encapsulant, the supporting member and the second encapsulant, so as to connect the first side of the first encapsulant to the third side of the second encapsulant; forming conductors in the perforations; and forming redistribution layer structures on the first side of the first encapsulant and the third side of the second encapsulant, such that the redistribution layer structures are electrically connected to the conductors and first and second semiconductor elements.

In an embodiment, the supporting member is connected to the first encapsulant by thermocompression bonding.

In an embodiment, the supporting member is interposed between the first and second package units by compression.

In an embodiment, the supporting member is a silicon-based material, such as glass or a wafer.

In an embodiment, the perforations are formed by laser drilling, and the supporting member is made by etching.

In an embodiment, the first and second semiconductor units are of the same size.

In an embodiment, the first and second semiconductor units are aligned or not aligned with each other.

From the above, in the semiconductor package and methods of manufacturing the same according to the present invention a supporting member is interposed between the first and second encapsulants, such that the supporting member provides sufficient support and protection to enhance the structural strength of the first and second package units after the carriers and the connection layers thereof are removed. Therefore, when compared with the prior art, the method of manufacturing a semiconductor package of the present invention can prevent the first and second package units from being damaged while the perforations are formed.

Moreover, the warpage levels of the first and second encapsulants are reduced by sufficient protection and support provided by the supporting member, whereby the positioning of perforations is prevented from shifting during the manufacturing of the perforations. Therefore, the electrical connections between the conductors are effectively secured during the formation of the redistribution structures, and problems such as poor yield, bad product reliability and high cost existing in the conventional methods of manufacturing a semiconductor package can be avoided.

BRIEF DESCRIPTION OF DRAWINGS

FIGS. 2A-2I are cross-sectional views of a method of manufacturing a semiconductor package according to the present invention, wherein FIGS. 2I' and 2I" present different embodiments of FIG. 2I.

DETAILED DESCRIPTION OF THE INVENTION

The following illustrative embodiments are provided to illustrate the disclosure of the present invention, these and other advantages and effects can be apparently understood by the in the art after reading the disclosure of this specification.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "first", "second", "third", "fourth" and "one" in this specification are only for the convenience to describe, not for limiting the scope of embodiment in this invention. The changes or adjustments of relative relationship without substantial change of technical content should also be considered within the category of implementation.

FIGS. 2A-2I are cross-sectional views of a method of manufacturing a semiconductor package 2 according to the present invention.

Figure 1A:
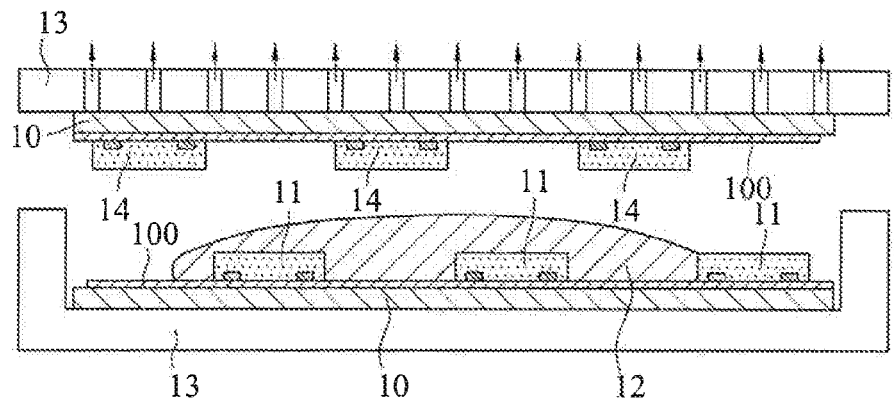
FIGS. 1A-1E are cross-sectional views of a method of manufacturing a semiconductor package according to the prior art.
Figure 1B:
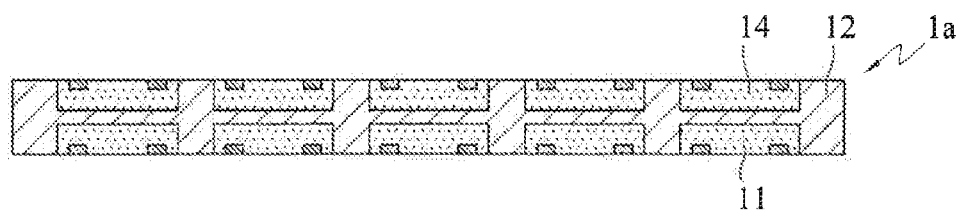
Figure 1C:
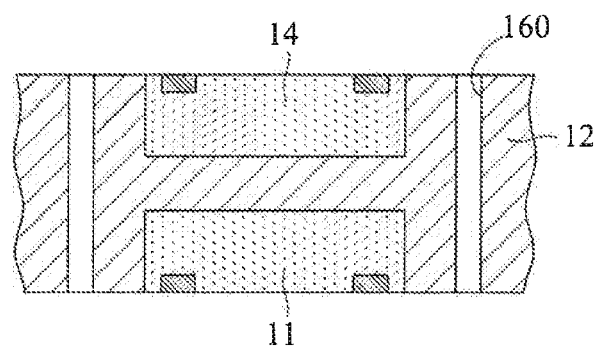
Figure 1D:
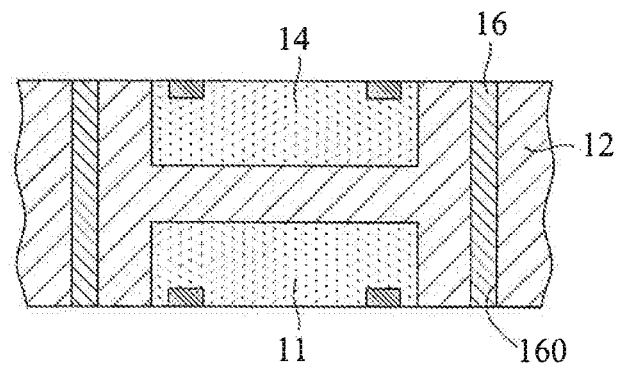
Figure 1E:
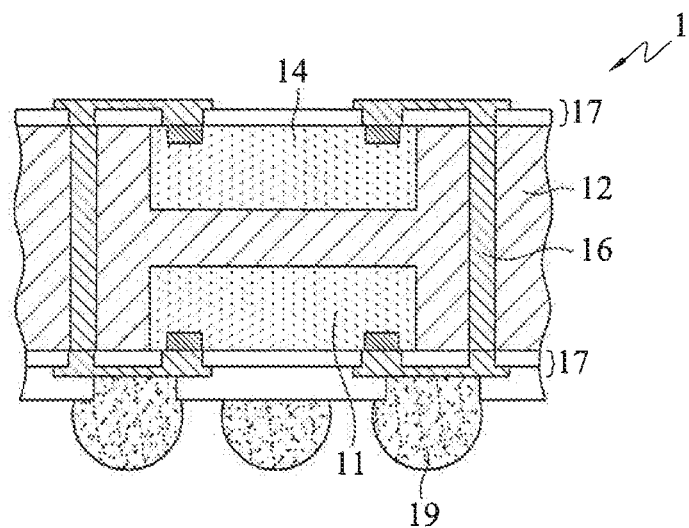
Figure 2A:
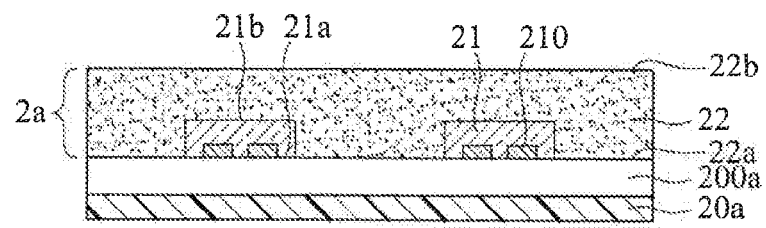

As shown in FIG. 2A, a plurality of first semiconductor elements 21 are formed on a connection layer 200a of a carrier 20a, and the first semiconductor elements 21 are encapsulated by a first encapsulant 22 such that first package unit 2a is thus manufactured.

In an embodiment, the first package unit 2a includes the first encapsulant 22 and the first semiconductor element 21, and the first encapsulant 22 is defined to have opposite first side 22a and second side 22b, wherein the first side 22a of the first encapsulant 22 is connected to the connection layer 200a, and the first semiconductor element 21 is embedded in the first side 22a of the first encapsulant 22.

Moreover, the first semiconductor element 21 is a chip having opposite active surface 21a and non-active surface 21b, and the active surface 21a is connected to the connection layer 200a and has a plurality of electrode pads 210 formed thereon. The active surface 21a is exposed to the first side 22a.

In an embodiment, the carrier 20a is a wafer-form substrate or a panel-form substrate, depending on the application need, and the connection layer 200a is a release film or glue.

Figure 2B:
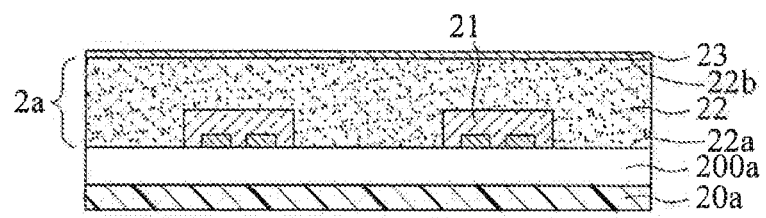

As shown in FIG. 2B, a supporting member 3 is disposed on the second side 22b of the first encapsulant 22.

In an embodiment, the supporting member 23 is made of a silicon-based material, and is such as glass or a wafer. The supporting member 23 is connected to the first encapsulant 22 by thermocompression bonding.

Moreover, if thick, the supporting member 23 may be thinned by a thinning process, such as a planarization process, to reduce the thickness of the supporting member 23, so as to facilitate a subsequent perforation process.

Figure 2C:
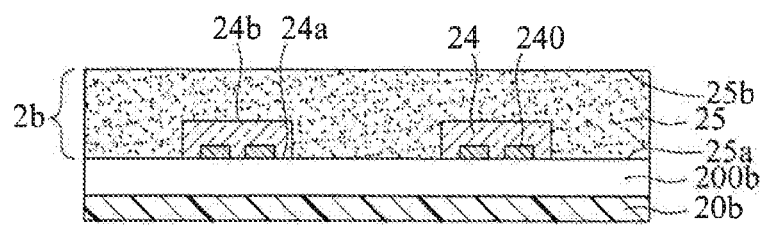

As shown in FIG. 2C, another carrier 20b having a connection layer 200b is also provided while the first package unit 2a is manufactured. A plurality of second semiconductor elements 24 are formed on the connection layer 200b of the another carrier 20b, and the second semiconductor elements 24 are encapsulated by a second encapsulant 25. A second package unit 2b is thus manufactured.

In an embodiment, the second package unit 2b includes the second encapsulant 25 and the second semiconductor element 24. The second encapsulant 25 has opposite third side 25a and fourth side 25b, and the third side 25a of the second encapsulant 25 is connected with the connection layer 200b.

The second semiconductor element 24 is embedded in the third side 25a of the second encapsulant 25.

The second semiconductor element 24 is a chip having opposite active surface 24a and non-active surface 24b, and the active surface 24a is connected to the connection layer 200b and has a plurality of electrode pads 240 formed thereon. The active surface 24a is exposed to the third side 25a.

Figure 2D:
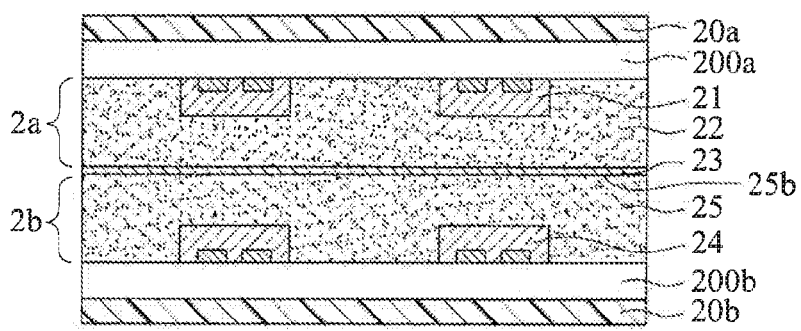

As shown in FIG. 2D, the fourth side 25b of the second encapsulant 25 is connected to the supporting member 23, such that the first package unit 2a and the second package unit 2b are coupled with each other.

As shown in an embodiment, the supporting member 23 connects the first package unit 2a to the second package unit 2b by thermocompression bonding.

Figure 2E:
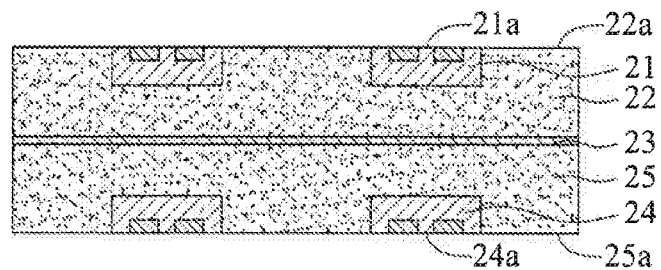

As shown in FIG. 2E, the carriers 20a and 20b and the connection layers 200a and 200b thereof are removed.

In an embodiment, the active surface 21a of the first semiconductor element 21 and the first side 22a of the first encapsulant 22 are coplanar, and the active surface 24a of the second semiconductor element 24 and the third side 25a of the second encapsulant 25 are also coplanar.

Figure 2F:
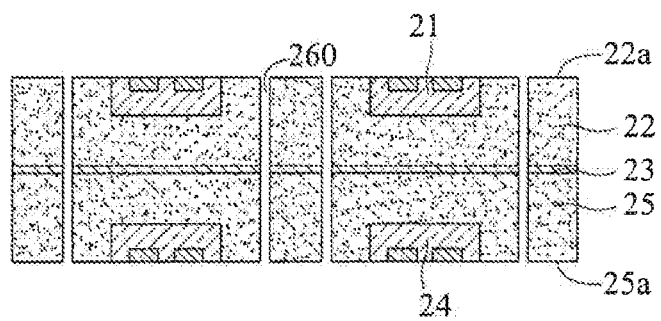

As shown in FIG. 2F, a plurality of perforations 260 penetrating the first encapsulant, the supporting member and the second encapsulant are formed so as to connect the first side 22a of the first encapsulant 22 and the third side 25a of the second encapsulant 25.

In an embodiment, the perforations 260 penetrate the first encapsulant 22 and second encapsulant 25 by laser, and penetrate the supporting member 23 by etching. For example, a laser drilling process is performed on the first side 22a of the first encapsulant 22 and the third side 25a of the second encapsulant 25, and then the supporting member 23 is etched through.

Figure 2G:
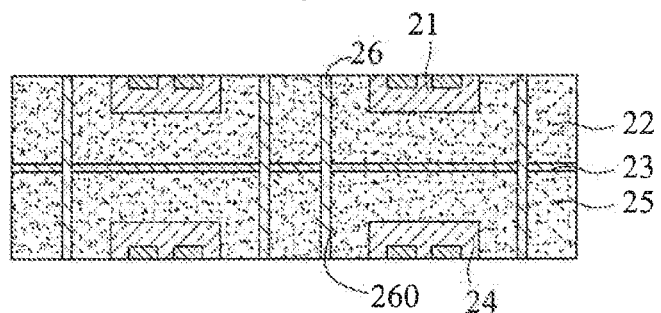

As shown in FIG. 2G, conductors 26 are formed in the perforations 260. In an embodiment, the conductors 26 are formed by copper electroplating.

Figure 2H:
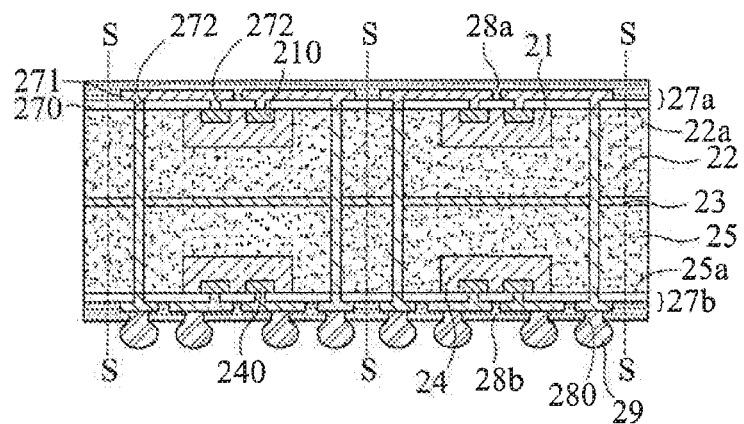

As shown in FIG. 2H, redistribution layer structures 27a and 27b are formed on the first side 22a of the first encapsulant 22 and the third side 25a of the second encapsulant 25, respectively, such that the redistribution layer structures 27a and 27b are electrically connected to the conductors 26 and first and second semiconductors 21 and 24.

In an embodiment, the redistribution layer structures 27a and 27b include at least a dielectric layer 270 and a circuit layer 271 formed thereon, and the circuit layer 271 is electrically connected to the conductors 26 and the electrode pads 210 and 240 by a plurality of conductive vias 272 formed in the dielectric layer 270.

Further, insulation protection layers 28a and 28b are formed on the dielectric layer 270 and the circuit layer 271, and one side of the insulation protection layer 28b has a plurality perforations 280 exposed to the circuit layer 271, allowing conductive elements 29 such as solder balls to be formed in the openings 280. Therefore, the conductive elements 29 are allowed to electrically connect the circuit layer 271 and external elements (not illustrated).

As shown in FIG. 2I, a singularizing process is performed along a cutting path S as shown in FIG. 2H, so as to manufacture a plurality of semiconductor packages 2.

In an embodiment, the first and second semiconductor elements 21 and 24 are of the same size and are aligned with each other, as shown in FIG. 2I, in which the first and second semiconductor elements 21 and 24 are both positioned in the center portion.

In another embodiment, the first and second semiconductor elements 21' and 24 are of different sizes. As shown in FIG. 2I', the width L of the first semiconductor element 21' is greater than the width W of the second semiconductor element 24. Alternatively, the width of the first semiconductor element 21' is less than the width of the second semiconductor element 24.

In another embodiment, the first and second semiconductor elements 21" and 24" are not aligned with each other. As shown in FIG. 2I", the first semiconductor element 21" is positioned to the left, while the second semiconductor element 24" is positioned to the right.

Figure 3:
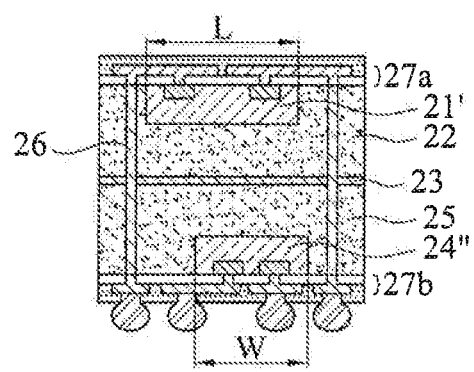
FIG. 3 presents a different embodiment of FIG. 2I.

In yet another embodiment, the first and second semiconductor elements 21' and 24" are of different sizes and are not aligned with each other, as shown in FIG. 3.

In a method of manufacturing a semiconductor package according to the present invention, the supporting member 23 is interposed between the first encapsulant 22 and the second encapsulant 25, such that the supporting member 23 provides sufficient support and protection to enhance the structural strength of the first and second package units 2a and 2b after the carriers 20a and 20 and the connection layers 200a and 200 thereof are removed. Therefore, when compared with the prior art, the manufacturing method of the present invention prevents the first and second package units 2a and 2b from being damaged while penetrating the perforations 260.

Moreover, the warpage of the first and second encapsulants 22 and 25 are reduced by sufficient protection and support provided by the supporting member 23, whereby the first and second package units 2a and 2b are enhanced in structure, and the positioning of perforations 260 is secured during the manufacturing of the perforations 260. Therefore, the electrical connections between the conductive vias 272 and the conductors 26 are effectively secured during the manufacturing of the redistribution structures, such that problems such as the poor yield, bad product reliability and high cost existing in the conventional method of manufacturing a semiconductor package can be avoided.

The present invention provides a semiconductor package 2 having a first package unit 2a, a second package unit 2b, a supporting member 23, a plurality of conductors 26, and a plurality of redistribution layer structures 27a and 27b.

The first package unit 2a includes a first encapsulant 22 having opposite first side 22a and second side 22b, and a first semiconductor 21, 21' or 21" embedded in and exposed to the first side 22a.

The second package unit 2b includes a second encapsulant 25 having opposite third side 25a and fourth side 25b, and a second semiconductor 24 or 24" embedded in and exposed to the third side 25a.

The supporting member 23 is made of a silicon-based material, and can be a glass or a wafer. The supporting member 23 is connected to the second side 22b of the first encapsulant 22 and the fourth side 25b of the second encapsulant 25, so as to couple the first package unit 2a to the second package unit 2b.

The conductors 26 penetrate the first encapsulant 22, the supporting member 23 and the second encapsulant 25 to connect the first side 22a of the first encapsulant 22 to the third side 25a of the second encapsulant 25.

The redistribution layer structures 27a and 27b are formed on the first side 22a of the first encapsulant 22 and the third side 25a of the second encapsulant 25, such that the redistribution layer structures 27a and 27b are electrically connected the conductors 26 and first and second semiconductor elements 21, 21' or 21" and 24 or 24".

In an embodiment, the first and second semiconductor elements 21 and 24 are the same in size.

In an embodiment, the first and second semiconductor elements 21' and 24 are different in size.

In an embodiment, the first and second semiconductor elements 21 and 24 are aligned with each other.

In an embodiment, the first and second semiconductor elements 21" and 24" are not aligned with each other.

In an embodiment, the first and second semiconductor elements 21' and 24" are of different sizes and not aligned with each other.

In summary, the semiconductor package and the method of manufacturing the same according to the present invention utilize the supporting member to enhance the structural strength of the first and second package units, and thus the first and second package units have sufficient support and protection after the carriers and the connection layers thereof are removed. Therefore, the first and second package units are prevented from being damaged during the manufacturing of the perforations.

Moreover, the warpage of the first and second encapsulants are reduced by sufficient protection and support provided by the supporting member, whereby the positioning of perforations is not shifted during the manufacturing of the perforations. Therefore, the electrical connections between the conductors are effectively secured during the manufacturing of the redistribution layer structures, such that problems such as the poor yield, bad product reliability and high cost existing in the conventional method of manufacturing a semiconductor package can be avoided.

The above embodiments only exemplarily specify the concept and effect of the invention, but not intend to limit the invention. Any person skilled in the art can perform modifications and adjustments on the above embodiments without departing the spirit and category of the invention.

What is claimed is:

1. A semiconductor package, comprising:
   a first package unit, including a first encapsulant having opposite first and second sides, and a first semiconductor element embedded in the first encapsulant and exposed to the first side;
   a second package unit, including a second encapsulant having opposite third and fourth sides, and a second semiconductor element embedded in the second encapsulant and exposed to the third side;
   a supporting member connecting the second side of the first encapsulant to the fourth side of the second encapsulant so as to couple the first package unit to the second package unit;
   a plurality of conductors penetrating the first encapsulant, the supporting member and the second encapsulant so as to connect the first side of the first encapsulant to the third side of the second encapsulant; and
   redistribution layer structures disposed on the first side of the first encapsulant and the third side of the second encapsulant, such that the redistribution layer structures are electrically connected to the conductors and first and second semiconductor elements.

2. The semiconductor package of claim 1, wherein the supporting member is made of a silicon-based material.

3. The semiconductor package of claim 2, wherein the silicon-based material is glass or a wafer.

4. The semiconductor package of claim 1, wherein the first and second semiconductor elements are of the same size.

5. The semiconductor package of claim 1, wherein the first and second semiconductor elements are of different sizes.

6. The semiconductor package of claim 1, wherein the first semiconductor element is aligned with the second semiconductor element.

7. The semiconductor package of claim 1, wherein the first semiconductor element is not aligned with the second semiconductor element.

8. A method for manufacturing a semiconductor package, comprising:
   providing a first package unit and a second package unit, wherein the first package unit includes a first encapsulant having opposite first and second sides, and a first semiconductor element embedded in the first encapsulant and exposed to the first side, the second package unit includes a second encapsulant having opposite third and fourth sides, and a second semiconductor element embedded in the second encapsulant and exposed to the third side, and the second side of the first encapsulant of the first package unit is coupled to a supporting member;
   mounting the fourth side of the second encapsulant on the supporting member, such that the first package unit and the second package unit are coupled with each other;
   forming a plurality of perforations penetrating the first encapsulant, the supporting member and the second encapsulant, such that the first side of the first encapsulant is connected to the third side of the second encapsulant;
   forming conductors in the perforations; and
   forming redistribution layer structures on the first side of the first encapsulant and the third side of the second encapsulant, such that the redistribution layer structures are electrically connected to the conductors and the first and second semiconductor elements.

9. The method of claim 8, wherein the supporting member is made of silicon-based material.

10. The method of claim 9, wherein the silicon-based material is glass or a wafer.

11. The method of claim 8, wherein the supporting member is connected to the first encapsulant by thermocompression bonding.

12. The method of claim 8, wherein the supporting member is interposed between the first package unit and the second package unit by compression.

13. The method of claim 8, wherein the first encapsulant and the second encapsulant are drilled by laser.

14. The method of claim 8, wherein the perforations of the supporting member are formed by etching.

15. The method of claim 8, wherein the first and second semiconductor elements are of the same size.

16. The method of claim 8, wherein the first and second semiconductor elements are of different sizes.

17. The method of claim 8, wherein the first semiconductor element is aligned with the second semiconductor element.

18. The method of claim 8, wherein the first semiconductor element is not aligned with the second semiconductor element.

* * * * *